US009445508B2

(12) United States Patent
Nakanishi et al.

(10) Patent No.: US 9,445,508 B2
(45) Date of Patent: Sep. 13, 2016

(54) SOLDER ALLOY, SOLDER PASTE, AND ELECTRONIC CIRCUIT BOARD

(71) Applicant: HARIMA CHEMICALS, INCORPORATED, Kakogawa-shi (JP)

(72) Inventors: Kensuke Nakanishi, Hyogo (JP); Kosuke Inoue, Hyogo (JP); Kazuya Ichikawa, Hyogo (JP); Tetsuyuki Shigesada, Hyogo (JP); Tadashi Takemoto, Ibaraki (JP)

(73) Assignee: HARIMA CHEMICALS, INCORPORATED, Hyogo (JP)

( * ) Notice: Subject to any disclaimer, the term of this patent is extended or adjusted under 35 U.S.C. 154(b) by 0 days.

(21) Appl. No.: 14/414,453

(22) PCT Filed: Jun. 25, 2013

(86) PCT No.: PCT/JP2013/067392
§ 371 (c)(1),
(2) Date: Jan. 13, 2015

(87) PCT Pub. No.: WO2014/013847
PCT Pub. Date: Jan. 23, 2014

(65) Prior Publication Data
US 2015/0305167 A1    Oct. 22, 2015

(30) Foreign Application Priority Data

Jul. 19, 2012   (JP) .................................. 2012-160239
Feb. 18, 2013  (JP) .................................. 2013-029247

(51) Int. Cl.
*C22C 13/00*   (2006.01)
*C22C 13/02*   (2006.01)
(Continued)

(52) U.S. Cl.
CPC ............ *H05K 3/3457* (2013.01); *B23K 35/025* (2013.01); *B23K 35/262* (2013.01);
(Continued)

(58) Field of Classification Search
CPC ...... C22C 13/00; C22C 13/02; B23K 35/262; H05K 3/3457
See application file for complete search history.

(56) References Cited

U.S. PATENT DOCUMENTS

| 2003/0015575 A1 | 1/2003 | Yamaguchi et al. |
| 2007/0036671 A1 | 2/2007 | Albrecht et al. |

(Continued)

FOREIGN PATENT DOCUMENTS

| CN | 1313802 A | 9/2001 |
| CN | 101208174 A | 6/2008 |

(Continued)

OTHER PUBLICATIONS

PCT International Preliminary Report on Patentability (IPRP) and Written Opinion issued on Jan. 29, 2015, in corresponding International Application No. PCT/JP2013/067392 (14 pages).

(Continued)

*Primary Examiner* — Scott Kastler
*Assistant Examiner* — Vanessa Luk
(74) *Attorney, Agent, or Firm* — Buchanan, Ingersoll & Rooney PC

(57) ABSTRACT

A solder alloy is a tin-silver-copper solder alloy, and contains tin, silver, copper, bismuth, nickel, and cobalt. Relative to the total amount of the solder alloy, the silver content is 2 mass % or more and 4 mass % or less, the nickel content is 0.01 mass % or more and 0.15 mass % or less, and the cobalt content is 0.001 mass % or more and 0.008 mass % or less.

18 Claims, 1 Drawing Sheet

(51) Int. Cl.
  *B23K 35/26* (2006.01)
  *H05K 3/34* (2006.01)
  *B23K 35/02* (2006.01)
  *H05K 1/09* (2006.01)

(52) U.S. Cl.
  CPC .............. *C22C 13/00* (2013.01); *C22C 13/02* (2013.01); *H05K 1/092* (2013.01); *H05K 3/3484* (2013.01); *H05K 3/3463* (2013.01)

(56) References Cited

U.S. PATENT DOCUMENTS

| | | | |
|---|---|---|---|
| 2008/0159903 A1 | 7/2008 | Lewis et al. | |
| 2008/0159904 A1* | 7/2008 | Lewis | C22C 13/00 420/561 |
| 2008/0292492 A1 | 11/2008 | Ingham et al. | |
| 2009/0218387 A1 | 9/2009 | Kurata et al. | |
| 2009/0232696 A1 | 9/2009 | Ohnishi et al. | |
| 2009/0304545 A1 | 12/2009 | Tanaka et al. | |
| 2010/0266870 A1 | 10/2010 | Nishimura | |
| 2010/0294565 A1 | 11/2010 | Kawamagta et al. | |
| 2010/0307823 A1 | 12/2010 | Kawamata et al. | |
| 2011/0120769 A1 | 5/2011 | Sakatani et al. | |
| 2011/0204121 A1 | 8/2011 | Kawamata et al. | |
| 2011/0274937 A1 | 11/2011 | Sugimori et al. | |
| 2012/0175020 A1* | 7/2012 | Imamura | B23K 35/025 148/24 |

FOREIGN PATENT DOCUMENTS

| | | | | |
|---|---|---|---|---|
| CN | 102066043 A | 5/2011 | | |
| EP | 1106301 A1 | 6/2001 | | |
| JP | 2000-015476 A | 1/2000 | | |
| JP | 2001-071131 A | 3/2001 | | |
| JP | 2001-071173 A | 3/2001 | | |
| JP | 2004-141910 A | 5/2004 | | |
| JP | 2008-521619 A | 6/2008 | | |
| JP | 2012-061491 A | 3/2012 | | |
| JP | WO 2012056753 A1 * | 5/2012 | .......... | B23K 35/025 |
| TW | 201016373 A | 5/2010 | | |
| WO | WO 2006/131979 A1 | 12/2006 | | |
| WO | WO 2009/011341 A1 | 1/2009 | | |
| WO | WO 2009/011392 A1 | 1/2009 | | |
| WO | WO 2010/087241 A1 | 8/2010 | | |
| WO | WO 2010/122764 A1 | 10/2010 | | |

OTHER PUBLICATIONS

International Search Report (PCT/ISA/210) mailed on Sep. 3, 2013, by the Japanese Patent Office as the International Searching Authority for International Application No. PCT/JP2013/067392.

Written Opinion (PCT/ISA/237) mailed on Sep. 3, 2013, by the Japanese Patent Office as the International Searching Authority for International Application No. PCT/JP2013/067392.

Extended Search Report issued by the European Patent Office in corresponding European Patent Application No. 13819569.8 on Jun. 2, 2016 (8 pages).

* cited by examiner

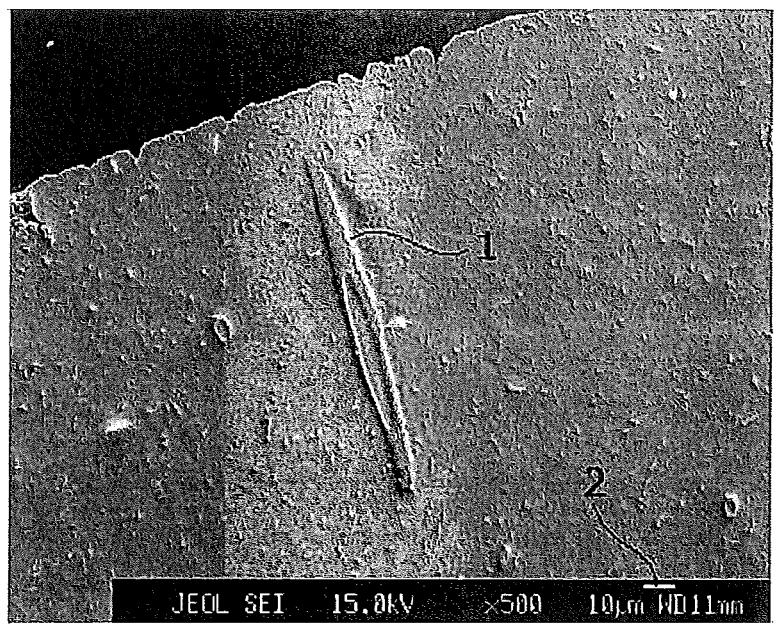

SOLDER ALLOY, SOLDER PASTE, AND ELECTRONIC CIRCUIT BOARD

TECHNICAL FIELD

The present invention relates to a solder alloy, a solder paste, and an electronic circuit board. In particular, the present invention relates to a tin-silver-copper solder alloy, a solder paste containing the solder alloy, and an electronic circuit board produced by using the solder paste.

BACKGROUND ART

Generally, in metal joints in electrical and electronic devices, solder joints using solder pastes are used, and for such a solder paste, conventionally, a solder alloy containing lead is used.

However, recently, it has been required to suppress lead usage in view of environmental burden, and therefore a solder alloy (lead-free solder alloy) containing no lead is under development.

For such a lead-free solder alloy, for example, a tin-copper alloy, a tin-silver-copper alloy, a tin-bismuth alloy, and a tin-zinc alloy have been well-known, and in particular, a tin-silver-copper alloy has been widely used because of its excellent strength.

For example, Patent Document 1 (Ref: Examples 18 to 25) below has proposed such a tin-silver-copper solder alloy of, for example, a lead-free solder for on-vehicle electronic circuits, the lead-free solder containing 2.8 to 4 mass % of Ag, 3 to 5.5 mass % of In, 0.5 to 1.1 mass % of Cu, furthermore Bi, Ni, Co, Fe, P, Ge, and Zn, and a remaining portion of Sn.

Furthermore, Patent Document 2 (Ref: Examples 7 to 13) has proposed still another tin-silver-copper solder alloy: a lead-free solder for vehicles, the lead-free solder containing, for example, 2.8 to 4 mass % of Ag, 1.5 to 6 mass % of Bi, 0.8 to 1.2 mass % of Cu, and furthermore, Ni, Co, Fe, P, Ge, and In, and a remaining portion of Sn.

CITATION LIST

Patent Document

Patent Document 1 WO 2009/011392
Patent Document 2 WO 2009/011341

SUMMARY OF THE INVENTION

Problem to be Solved by the Invention

Meanwhile, improvement in durability (fatigue resistance, particularly cold thermal fatigue) has been required for such a solder alloy.

Furthermore, for such a solder alloy, it has been required that the melting point be low, and crack resistance and erosion resistance are improved, and voids (gaps) are suppressed.

An object of the present invention is to provide a solder alloy that allows for a low melting point, excellent mechanical characteristics such as durability, crack resistance, and erosion resistance, and furthermore, suppression of voids (gaps) generation; a solder paste containing the solder alloy; and an electronic circuit board produced by using the solder paste.

Means for Solving the Problem

A solder alloy in an aspect of the present invention is a tin-silver-copper solder alloy, and contains tin, silver, copper, bismuth, nickel, and cobalt, wherein relative to the total amount of the solder alloy, the silver content is 2 mass % or more and 4 mass % or less, the nickel content is 0.01 mass % or more and 0.15 mass % or less, and the cobalt content is 0.001 mass % or more and 0.008 mass % or less.

In the solder alloy, it is preferable that the mass ratio (Ni/Co) of the nickel content relative to the cobalt content is 8 or more and 12 or less.

In the solder alloy, it is preferable that the bismuth content relative to the total amount of the solder alloy is 1.8 mass % or more and 4.2 mass % or less.

It is preferable that the solder alloy further contains antimony, and relative to the total amount of the solder alloy, the antimony content is 0.1 mass % or more and 5.0 mass % or less, and the bismuth content is 0.8 mass % or more and 3.0 mass % or less.

It is preferable that the solder alloy further contains indium, and the indium content relative to the total amount of the solder alloy is 2.2 mass % or more and 6.2 mass % or less.

In the solder alloy, it is preferable that the mass ratio (In/Bi) of the indium content relative to the bismuth content is 0.5 or more and 4.2 or less.

In the solder alloy, it is preferable that the copper content relative to the total amount of the solder alloy is 0.3 mass % or more and 0.7 mass % or less.

A solder paste in another aspect of the present invention contains a flux and a solder powder composed of the above-described solder alloy.

An electronic circuit board in still another aspect of the present invention includes a soldered portion soldered by the above-described solder paste.

Effect of the Invention

A solder alloy in an aspect of the present invention contains tin, silver, copper, bismuth, nickel, and cobalt in a tin-silver-copper solder alloy, and relative to the total amount of the solder alloy, the silver content is 2 mass % or more and 4 mass % or less, the nickel content is 0.01 mass % or more and 0.15 mass % or less, and the cobalt content is 0.001 mass % or more and 0.008 mass % or less; therefore, the melting point can be suppressed to a low level, and excellent mechanical characteristics such as durability, crack resistance, and erosion resistance can be achieved, and furthermore, voids (gaps) generation can be suppressed.

A solder paste in another aspect of the present invention contains the above-described solder alloy; and therefore, the melting point can be suppressed to a low level, excellent mechanical characteristics such as durability, crack resistance, and erosion resistance can be achieved, and furthermore, voids (gaps) generation can be suppressed.

In an electronic circuit board in still another aspect of the present invention, the above-described solder paste is used in soldering, and therefore at the soldered portion, excellent mechanical characteristics such as durability, crack resistance, and erosion resistance can be achieved, and furthermore, voids (gaps) generation can be suppressed.

BRIEF DESCRIPTION OF THE DRAWINGS

FIG. 1 is an SEM (Scanning Electron Microscopic) photograph showing an intermetallic compound structure formed at the solder's cross section after reflowing.

EMBODIMENT OF THE INVENTION

A solder alloy in an aspect of the present invention is a tin-silver-copper solder alloy, and contains tin, silver, copper, bismuth, nickel, and cobalt as essential components.

In such a solder alloy, the tin content is a remaining percentage deducting the percentage for the other components to be described later from the whole, and is suitably set in accordance with the amounts of the components blended.

The silver content relative to the total amount of the solder alloy is 2 mass % or more, preferably more than 2 mass %, more preferably 2.5 mass % or more, and 4 mass % or less, preferably less than 4 mass %, more preferably 3.8 mass % or less.

In the above-described solder alloy, the silver content is set in the above-described range, and therefore excellent strength, durability, and crack resistance can be achieved.

In contrast, when the silver content is less than the above-described lower limit, strength may be poor, and exhibition of the effects of copper to be described later (erosion resistance) is hindered. When the silver content is more than the above-described upper limit, the melting point is increased, and mechanical characteristics such as elongation and crack resistance are reduced. Furthermore, excessive silver hinders the effects of cobalt and germanium to be described later (durability) to be exhibited.

The copper content relative to the total amount of the solder alloy is, for example, 0.1 mass % or more, preferably 0.3 mass % or more, more preferably 0.4 mass % or more, and for example, 1 mass % or less, preferably 0.7 mass % or less, more preferably 0.6 mass % or less.

When the copper content is in the above-described range, excellent erosion resistance and strength can be ensured.

Meanwhile, when the copper content is less than the above-described lower limit, erosion resistance is poor, and copper erosion may be caused. That is, when the copper content is less than the above-described lower limit, and when soldering by the solder alloy, the copper pattern or through-hole in the electronic circuit board may be dissolved by the solder alloy (copper erosion). When the copper content is more than the above-described upper limit, durability (particularly cold thermal fatigue) may be poor and strength may be poor.

The bismuth content relative to the total amount of the solder alloy is, for example, 0.5 mass % or more, preferably 0.8 mass % or more, more preferably 1.2 mass % or more, even more preferably 1.8 mass % or more, particularly preferably 2.2 mass % or more, and for example, 4.8 mass % or less, preferably 4.2 mass % or less, more preferably 3.5 mass % or less, even more preferably 3.0 mass % or less.

When the bismuth content is within the above-described range, the melting point can be suppressed to a low level, and excellent strength and durability can be ensured.

Meanwhile, when the bismuth content is less than the above-described lower limit, crack resistance and strength may be poor, and furthermore, durability may also be poor. When the bismuth content is more than the above-described upper limit as well, crack resistance and strength may be poor, and furthermore, durability may also be poor.

The nickel content relative to the total amount of the solder alloy is 0.01 mass % or more, preferably 0.03 mass % or more, more preferably 0.04 mass % or more, and 0.15 mass % or less, preferably 0.1 mass % or less, more preferably 0.06 mass % or less.

When the nickel content is in the above-described range, the solder can be finely structured, and crack resistance, strength, and durability can be improved.

Meanwhile, when the nickel content is less than the above-described lower limit, durability is poor, and furthermore, fine structure cannot be achieved, and crack resistance and strength are poor. When the nickel content is more than the above-described upper limit, durability is poor, and the melting point of the solder alloy is increased, and wettability is reduced, reducing practicality of the solder paste.

The cobalt content relative to the total amount of the solder alloy is 0.001 mass % or more, preferably 0.003 mass % or more, more preferably 0.004 mass % or more, and 0.008 mass % or less, preferably 0.006 mass % or less.

When the solder alloy contains cobalt, in a solder paste produced from the solder alloy, an intermetallic compound layer (e.g., Sn—Cu, Sn—Co, Sn—Cu—Co, etc.) formed at soldered interface may become thick, and growth of the solder alloy may be difficult even with thermal burden and burden due to thermal changes. The solder is reinforced by dispersing and depositing cobalt in the solder.

When the solder alloy contains cobalt in the above-described ratio, the solder can be finely structured, and excellent crack resistance, strength, and durability can be improved, and furthermore, voids generation can be suppressed.

Meanwhile, when the cobalt content is less than the above-described lower limit, durability is poor, and furthermore, fine structure cannot be achieved, and crack resistance and strength are poor. When the cobalt content is more than the above-described upper limit, there are disadvantages in that durability is poor, and furthermore, voids generation cannot be suppressed.

The mass ratio (Ni/Co) of the nickel content relative to the cobalt content is, for example, 1 or more, preferably 5 or more, more preferably 8 or more and for example, 200 or less, preferably 100 or less, more preferably 50 or less, even more preferably 20 or less, particularly preferably 12 or less.

When the mass ratio (Ni/Co) of nickel to cobalt is in the above-described range, the solder can be finely structured, and excellent crack resistance and strength can be ensured.

Meanwhile, when the mass ratio (Ni/Co) of nickel to cobalt is less than the above-described lower limit, fine structure cannot be achieved, crack resistance and strength may be poor, and voids generation may not be suppressed. When the mass ratio (Ni/Co) of nickel to cobalt is the above-described upper limit or more as well, fine structure cannot be achieved, crack resistance and strength may be poor, and voids generation may not be suppressed.

The above-described solder alloy may further contain, as optional components, antimony, indium, and germanium.

The antimony content relative to the total of the solder alloy is 0.1 mass % or more, preferably 0.2 mass % or more, more preferably 0.4 mass % or more, and for example, 5.0 mass % or less, preferably 4.5 mass % or less, more preferably 4.0 mass % or less.

When the antimony content is within the above-described range, strength can be improved, and furthermore, antimony forms a solid solution in tin, improving heat resistance and durability.

Meanwhile, when the antimony content is less than the above-described lower limit, strength and durability may be poor. When the antimony content is more than the above-described upper limit as well, strength and durability may be poor.

When the antimony content is in the above-described range, the bismuth content is preferably, for example, 0.5 mass % or more, preferably 0.8 mass % or more, more preferably 1.2 mass % or more, and for example, 4.2 mass % or less, preferably 3.5 mass % or less, more preferably 3.0 mass % or less.

When the antimony content and the bismuth content are within the above-described range, strength, heat resistance, and durability can be improved.

The indium content relative to the total amount of the solder alloy is, for example, 2.2 mass % or more, preferably 2.8 mass % or more, more preferably 3.8 mass % or more, and for example, 6.2 mass % or less, preferably 5.7 mass % or less, more preferably 5.2 mass % or less, particularly preferably 4.5 mass % or less.

When the indium content is in the above-described range, excellent crack resistance, strength and durability can be ensured.

That is, the solder alloy contains tin and silver, and therefore generally $Ag_3Sn$ (silver 3 tin) structure is present. Such $Ag_3Sn$ structure agglomerates by repetitive ups and downs of temperature, and may cause cracks.

In contrast, when the solder alloy contains indium in the above-described ratio, agglomeration of $Ag_3Sn$ is hindered, and the $Ag_3Sn$ structure can be finely formed, and therefore crack resistance and strength can be improved.

Meanwhile, when the indium content is less than the above-described lower limit, fine structure cannot be achieved, crack resistance and strength may be poor, and furthermore, durability may also be poor. When the indium content is more than the above-described upper limit as well, fine structure cannot be achieved, crack resistance and strength may be poor, and furthermore, durability may also be poor.

The mass ratio (In/Bi) of the indium content relative to the bismuth content is, for example, 0.5 or more, preferably 0.8 or more, more preferably 1.3 or more, and for example, 4.2 or less, preferably 3 or less, more preferably 2.2 or less, particularly preferably 1.8 or less.

When the mass ratio (In/Bi) of indium relative to bismuth is in the above-described range, excellent strength and wettability can be ensured.

Meanwhile, when the mass ratio (In/Bi) of indium relative to bismuth is less than the above-described lower limit, strength and wettability may be poor. When the mass ratio (In/Bi) of indium relative to bismuth is more than the above-described upper limit as well, strength and wettability may be poor.

The germanium content relative to the total amount of the solder alloy is 0.001 mass % or more, preferably 0.002 mass % or more, and less than 1 mass %, preferably 0.007 mass % or less.

When the germanium content is in the above-described range, a thin oxide is formed on the solder surface, which can improve durability.

Furthermore, by allowing cobalt and germanium to coexist, their synergistic effects allows for improvement in extensibility and resistance to deformation with thermal stress application, which improves durability.

Meanwhile, when the germanium content is less than the above-described lower limit, durability may be poor, and furthermore, wettability may be poor. When the germanium content is more than the above-described upper limit, solder surface is excessively oxidized, and therefore wettability and strength may be poor.

Such a solder alloy can be produced by alloying with a known method, for example, by melting the above-described metal components in a melting furnace, and homogenizing the mixture.

The metal components are not particularly limited, and in view of homogeneously melting the metal components, preferably, powder state metals are used.

The average particle size of the metal powder is not particularly limited, and with a particle size·particle size distribution analyzer by laser diffraction, for example, 5 μm or more, preferably 15 μm or more, for example, 100 μm or less, preferably 50 μm or less.

The metal powder used in production of the solder alloy may contain a trace amount of impurities (unavoidable impurity) to the extent that does not hinder excellent effects of the present invention.

The thus obtained solder alloy has a melting point measured by DSC method (measurement conditions: temperature increase rate 0.5° C./min) of, for example, 190° C. or more, preferably 200° C. or more, for example, 250° C. or less, preferably 240° C. or less.

When the solder alloy has a melting point in the above-described range, when used for the solder paste, metals can be joined with excellent ease and workability.

The above-described solder alloy contains, in the tin-silver-copper solder alloy, tin, silver, copper, bismuth, nickel, and cobalt, and relative to the total amount of the solder alloy, the silver content is 2 mass % or more and 4 mass % or less, the nickel content is 0.01 mass % or more and 0.15 mass % or less, and the cobalt content is 0.001 mass % or more and 0.008 mass % or less, and therefore the melting point can be suppressed to a low level, excellent mechanical characteristics such as durability, crack resistance, and erosion resistance can be provided, and furthermore, voids (gaps) generation can be suppressed.

Thus, such a solder alloy is preferably contained in a solder paste (solder paste bonding material).

To be specific, the solder paste in another aspect of the present invention contains the above-described solder alloy, and a flux.

In the solder paste, the solder alloy is contained preferably as a powder.

The powder shape is not particularly limited, and for example, the powder shape can be substantially complete spherical, for example, flat block, and for example, acicular, and can also be amorphous. The powder shape is set suitably in accordance with the characteristics required for the solder paste (e.g., thixotropy, sagging resistance, etc.).

The solder alloy powder has an average particle size (when spherical), or an average longitudinal direction length (when not spherical) of, with a particle size ° particle size distribution analyzer by laser diffraction, for example, 5 μm or more, preferably 15 μm or more, and for example, 100 μm or less, preferably 50 μm or less.

The flux is not particularly limited, and a known solder flux may be used.

To be specific, the flux is mainly composed of, for example, base resin (rosin, acrylic resin, etc.), an activator (e.g., hydrohalic acid salt of amines such as ethylamine and propylamine, and organic carboxylic acids such as, for example, lactic acid, citric acid, benzoic acid, etc.), and a thixotropic agent (hydrogenated castor oil, beeswax, carnauba wax, etc.), and when the flux is used in a liquid state, an organic solvent may further be contained.

The solder paste can be produced by mixing the above-described powder composed of the solder alloy, and the above-described flux by a known method.

The mixing ratio (solder alloy:flux (mass ratio)) of the solder alloy (powder) to the flux is, for example, 70:30 to 90:10.

The above-described solder paste contains the solder alloy in an aspect of the present invention, and therefore the melting point can be suppressed to a low level, and excellent mechanical characteristics such as durability, crack resistance, and erosion resistance can be achieved, and furthermore, voids (gaps) generation can be suppressed.

The present invention includes an electronic circuit board including a soldered portion soldered by the above-described solder paste.

That is, the above-described solder paste is suitably used in, for example, soldering (metal joining) of electrodes in electronic circuit boards of electrical and electronic devices to an electronic component.

The electronic component is not particularly limited, and includes a known electronic component such as, for example, resistor, diode, condenser, and transistor.

In the electronic circuit board, in soldering, the above-described solder paste is used, and therefore excellent mechanical characteristics such as durability, crack resistance, and erosion resistance can be achieved at the soldered portion, and furthermore, voids (gaps) generation can be suppressed.

The above-described method for using the solder alloy of the present invention is not limited to the above-described solder paste, and for example, can be used for production of flux-cored solder materials. To be specific, for example, a flux-cored solder material can also be produced by a known method (e.g., extrusion molding, etc.), by molding the above-described solder alloy into a line with the above-described flux as the core.

The flux-cored solder material as well can be suitably used in, as the solder paste, for example, soldering (metal joining) of an electronic circuit board such as electrical and electronic devices.

EXAMPLES

The present invention is described below based on Examples and Comparative Examples, but the present invention is not limited to Examples below.

Examples 1 to 54 and Comparative Examples 1 to 20

Preparation of Solder Alloy

Powders of the metals shown in Tables 1 to 2 were mixed at the mixing ratio shown in Tables 1 to 3, and the produced mixture of metals was melted in a melting furnace and was homogenized, thereby preparing a solder alloy. The mixing ratio of tin (Sn) in the mixing formulation of Examples and Comparative Examples is the remainder deducting the mixing ratio (mass %) of metals (silver (Ag), copper (Cu), indium (In), bismuth (Bi), antimony (Sb), nickel (Ni), and cobalt (Co)) shown in Tables 1 to 3 from the whole.

In the solder alloys of Examples 1 to 3, the metals of Ag, Cu, In, Bi, Ni, and Co were blended at the ratio shown in Table 1, and for the remaining percentage, Sn was used.

In Examples 4 to 14, solder alloys were produced based on the formulation of Example 2, except that the mixing ratio of Ni and/or Co was increased or decreased.

In Examples 15 to 33, solder alloys were produced based on the formulation of Example 2, except that the mixing ratio of In and/or Bi was increased or decreased.

In Examples 34 to 43, solder alloys were produced based on the formulation of Example 2, except that Sb was further added and the mixing ratios of Ag, In, Bi, and Sb were decreased or increased.

In Examples 44 to 54, solder alloys were produced based on the formulation of Example 2, except that In was not added, Sb was added, and the mixing ratios of Ag, Bi, and Sb were decreased or increased in accordance with Examples 34 to 42.

In Comparative Examples 1 to 7, solder alloys were produced based on the formulation of Example 2, except that the mixing ratio of Ni and/or Co was set to 0, or to an excessive amount or an insufficient amount.

In Comparative Examples 8 to 15, solder alloys were produced based on the formulation of Example 2, except that the mixing ratio of one of Ni and Co was set to an excessive amount or to an insufficient amount, and the mixing ratio of the other of Ni and Co was decreased or increased in accordance with Examples 4 to 14.

In Comparative Example 6, a solder alloy was produced based on the formulation of Example 2, except that the mixing ratio of the Cu was set to 0.

In Comparative Example 17, a solder alloy was produced by blending the metals of Ag, Cu, In, and Ni at the proportion shown in Table 3, and for the remaining percentage, Sn was used. In Comparative Example 18, a solder alloy was produced by blending the metals of Ag, Cu, In, Bi, and Co at the proportion shown in Table 3, and for the remaining percentage, Sn was used.

In Comparative Example 19, a solder alloy was produced by blending the metals of Ag, Cu, Bi, and Ni at the proportion shown in Table 3, and for the remaining percentage, Sn was used. In Comparative Example 20, a solder alloy was produced by blending the metals of Ag, Cu, Bi, and Co at the proportion shown in Table 3, and for the remaining percentage, Sn was used.

Preparation of Solder Paste

The produced solder alloy was made into a powder with a particle size of 25 to 38 μm, and the produced solder alloy powder and a known flux were mixed, thereby producing a solder paste.

Evaluation on Solder Paste

The produced solder paste was printed on a printed circuit board for mounting chip components, and chip components were mounted by reflowing. The printing conditions for the solder paste at the time of mounting, and the size of the chip components were set suitably in accordance with evaluations described later.

TABLE 1

| No. | Mixing formulation (mass %) | | | | | | | Ni/Co (Mass ratio) | In/Bi (Mass ratio) |
| --- | --- | --- | --- | --- | --- | --- | --- | --- | --- |
| | Ag | Cu | In | Bi | Sb | Ni | Co | | |
| Example 1 | 2.6 | 0.5 | 4.0 | 3.0 | — | 0.05 | 0.005 | 10 | 1.33 |
| Example 2 | 3.0 | 0.5 | 4.3 | 2.7 | — | 0.05 | 0.005 | 10 | 1.59 |
| Example 3 | 3.7 | 0.5 | 4.0 | 2.5 | — | 0.05 | 0.005 | 10 | 1.60 |
| Example 4 | 3.0 | 0.5 | 4.3 | 2.7 | — | 0.01 | 0.001 | 10 | 1.59 |
| Example 5 | 3.0 | 0.5 | 4.3 | 2.7 | — | 0.01 | 0.005 | 2 | 1.59 |
| Example 6 | 3.0 | 0.5 | 4.3 | 2.7 | — | 0.01 | 0.008 | 1.25 | 1.59 |
| Example 7 | 3.0 | 0.5 | 4.3 | 2.7 | — | 0.05 | 0.001 | 50 | 1.59 |
| Example 8 | 3.0 | 0.5 | 4.3 | 2.7 | — | 0.05 | 0.008 | 6.25 | 1.59 |
| Example 9 | 3.0 | 0.5 | 4.3 | 2.7 | — | 0.07 | 0.001 | 70 | 1.59 |
| Example 10 | 3.0 | 0.5 | 4.3 | 2.7 | — | 0.07 | 0.005 | 14 | 1.59 |
| Example 11 | 3.0 | 0.5 | 4.3 | 2.7 | — | 0.07 | 0.008 | 8.75 | 1.59 |
| Example 12 | 3.0 | 0.5 | 4.3 | 2.7 | — | 0.15 | 0.001 | 150 | 1.59 |
| Example 13 | 3.0 | 0.5 | 4.3 | 2.7 | — | 0.15 | 0.005 | 30 | 1.59 |
| Example 14 | 3.0 | 0.5 | 4.3 | 2.7 | — | 0.15 | 0.008 | 18.75 | 1.59 |
| Example 15 | 3.0 | 0.5 | 3.0 | 2.0 | — | 0.05 | 0.005 | 10 | 1.50 |
| Example 16 | 3.0 | 0.5 | 3.0 | 3.0 | — | 0.05 | 0.005 | 10 | 1.00 |
| Example 17 | 3.0 | 0.5 | 3.0 | 4.0 | — | 0.05 | 0.005 | 10 | 0.75 |
| Example 18 | 3.0 | 0.5 | 4.0 | 2.0 | — | 0.05 | 0.005 | 10 | 2.00 |
| Example 19 | 3.0 | 0.5 | 4.0 | 4.0 | — | 0.05 | 0.005 | 10 | 1.00 |
| Example 20 | 3.0 | 0.5 | 5.0 | 2.0 | — | 0.05 | 0.005 | 10 | 2.50 |

TABLE 1-continued

| No. | Ag | Cu | In | Bi | Sb | Ni | Co | Ni/Co (Mass ratio) | In/Bi (Mass ratio) |
|---|---|---|---|---|---|---|---|---|---|
| Example 21 | 3.0 | 0.5 | 5.0 | 3.0 | — | 0.05 | 0.005 | 10 | 1.67 |
| Example 22 | 3.0 | 0.5 | 5.0 | 4.0 | — | 0.05 | 0.005 | 10 | 1.25 |
| Example 23 | 3.0 | 0.5 | 5.5 | 2.0 | — | 0.05 | 0.005 | 10 | 2.75 |
| Example 24 | 3.0 | 0.5 | 5.5 | 3.0 | — | 0.05 | 0.005 | 10 | 1.83 |
| Example 25 | 3.0 | 0.5 | 5.5 | 4.0 | — | 0.05 | 0.005 | 10 | 1.38 |

TABLE 2

| No. | Ag | Cu | In | Bi | Sb | Ni | Co | Ni/Co (Mass ratio) | In/Bi (Mass ratio) |
|---|---|---|---|---|---|---|---|---|---|
| Example 26 | 3.0 | 0.5 | 2.5 | 3.0 | — | 0.05 | 0.005 | 10 | 0.83 |
| Example 27 | 3.0 | 0.5 | 6.0 | 3.0 | — | 0.05 | 0.005 | 10 | 2.00 |
| Example 28 | 3.0 | 0.5 | 4.0 | 1.5 | — | 0.05 | 0.005 | 10 | 2.67 |
| Example 29 | 3.0 | 0.5 | 4.0 | 4.5 | — | 0.05 | 0.005 | 10 | 0.89 |
| Example 30 | 3.0 | 0.5 | 2.5 | 1.5 | — | 0.05 | 0.005 | 10 | 1.67 |
| Example 31 | 3.0 | 0.5 | 6.0 | 4.5 | — | 0.05 | 0.005 | 10 | 1.33 |
| Example 32 | 3.0 | 0.5 | 2.5 | 4.5 | — | 0.05 | 0.005 | 10 | 0.56 |
| Example 33 | 3.0 | 0.5 | 6.0 | 1.5 | — | 0.05 | 0.005 | 10 | 4.00 |
| Example 34 | 3.0 | 0.5 | 4.3 | 2.7 | 1.5 | 0.05 | 0.005 | 10 | 1.59 |
| Example 35 | 3.0 | 0.5 | 4.3 | 2.7 | 3.0 | 0.05 | 0.005 | 10 | 1.59 |
| Example 36 | 3.8 | 0.5 | 4.3 | 2.7 | 1.5 | 0.05 | 0.005 | 10 | 1.59 |
| Example 37 | 3.0 | 0.5 | 4.3 | 1.0 | 3.0 | 0.05 | 0.005 | 10 | 4.30 |
| Example 38 | 3.0 | 0.5 | 4.3 | 2.7 | 0.5 | 0.05 | 0.005 | 10 | 1.59 |
| Example 39 | 3.0 | 0.5 | 4.3 | 2.7 | 1.0 | 0.05 | 0.005 | 10 | 1.59 |
| Example 40 | 3.0 | 0.5 | 4.3 | 0.5 | 1.5 | 0.05 | 0.005 | 10 | 8.60 |
| Example 41 | 3.0 | 0.5 | 4.3 | 3.5 | 1.5 | 0.05 | 0.005 | 10 | 1.23 |
| Example 42 | 3.0 | 0.5 | 4.3 | 2.7 | 0.2 | 0.05 | 0.005 | 10 | 1.59 |
| Example 43 | 3.0 | 0.5 | 4.3 | 2.7 | 4.5 | 0.05 | 0.005 | 10 | 1.59 |
| Example 44 | 3.0 | 0.5 | — | 2.0 | 3.8 | 0.05 | 0.005 | 10 | — |
| Example 45 | 3.0 | 0.5 | — | 2.7 | 1.5 | 0.05 | 0.005 | 10 | — |
| Example 46 | 3.0 | 0.5 | — | 2.7 | 3.0 | 0.05 | 0.005 | 10 | — |
| Example 47 | 3.8 | 0.5 | — | 2.7 | 1.5 | 0.05 | 0.005 | 10 | — |
| Example 48 | 3.0 | 0.5 | — | 1.0 | 3.0 | 0.05 | 0.005 | 10 | — |
| Example 49 | 3.0 | 0.5 | — | 2.7 | 0.5 | 0.05 | 0.005 | 10 | — |
| Example 50 | 3.0 | 0.5 | — | 2.7 | 1.0 | 0.05 | 0.005 | 10 | — |
| Example 51 | 3.0 | 0.5 | — | 0.5 | 1.5 | 0.05 | 0.005 | 10 | — |
| Example 52 | 3.0 | 0.5 | — | 3.5 | 1.5 | 0.05 | 0.005 | 10 | — |
| Example 53 | 3.0 | 0.5 | — | 2.7 | 0.2 | 0.05 | 0.005 | 10 | — |
| Example 54 | 3.0 | 0.5 | — | 2.7 | 4.5 | 0.05 | 0.005 | 10 | — |

TABLE 3

| No. | Ag | Cu | In | Bi | Sb | Ni | Co | Ni/Co (Mass ratio) | In/Bi (Mass ratio) |
|---|---|---|---|---|---|---|---|---|---|
| Comparative Example 1 | 3.0 | 0.5 | 4.3 | 2.7 | — | Not contained | Not contained | — | 1.59 |
| Comparative Example 2 | 3.0 | 0.5 | 4.3 | 2.7 | — | 0.05 | Not contained | — | 1.59 |
| Comparative Example 3 | 3.0 | 0.5 | 4.3 | 2.7 | — | 0.05 | 0.0005 | 100 | 1.59 |
| Comparative Example 4 | 3.0 | 0.5 | 4.3 | 2.7 | — | 0.05 | 0.01 | 5 | 1.59 |
| Comparative Example 5 | 3.0 | 0.5 | 4.3 | 2.7 | — | Not contained | 0.005 | — | 1.59 |
| Comparative Example 6 | 3.0 | 0.5 | 4.3 | 2.7 | — | 0.005 | 0.005 | 1 | 1.59 |
| Comparative Example 7 | 3.0 | 0.5 | 4.3 | 2.7 | — | 0.2 | 0.005 | 40 | 1.59 |
| Comparative Example 8 | 3.0 | 0.5 | 4.3 | 2.7 | — | 0.01 | 0.0005 | 20 | 1.59 |
| Comparative Example 9 | 3.0 | 0.5 | 4.3 | 2.7 | — | 0.01 | 0.01 | 1 | 1.59 |
| Comparative Example 10 | 3.0 | 0.5 | 4.3 | 2.7 | — | 0.15 | 0.0005 | 300 | 1.59 |
| Comparative Example 11 | 3.0 | 0.5 | 4.3 | 2.7 | — | 0.15 | 0.01 | 15 | 1.59 |
| Comparative Example 12 | 3.0 | 0.5 | 4.3 | 2.7 | — | 0.005 | 0.001 | 5 | 1.59 |
| Comparative Example 13 | 3.0 | 0.5 | 4.3 | 2.7 | — | 0.005 | 0.008 | 0.625 | 1.59 |
| Comparative Example 14 | 3.0 | 0.5 | 4.3 | 2.7 | — | 0.2 | 0.001 | 200 | 1.59 |
| Comparative Example 15 | 3.0 | 0.5 | 4.3 | 2.7 | — | 0.2 | 0.008 | 25 | 1.59 |
| Comparative Example 16 | 3.0 | Not contained | 4.3 | 2.7 | — | 0.05 | 0.005 | 10 | 1.59 |
| Comparative Example 17 | 3.0 | 1.0 | 5.0 | Not contained | — | 0.03 | Not contained | — | — |
| Comparative Example 18 | 3.0 | 1.0 | 5.0 | 0.5 | — | Not contained | 0.01 | — | 10.00 |
| Comparative Example 19 | 3.0 | 0.9 | Not contained | 3.0 | — | 0.03 | Not contained | — | — |
| Comparative Example 20 | 3.0 | 0.9 | Not contained | 3.0 | — | Not contained | 0.01 | — | — |

Evaluation

The solder paste produced in Examples and Comparative Examples was evaluated as shown below. The results are shown in Tables 4 to 6.

<Crack Resistance (Size of Intermetallic Compound Structure)>

The solder paste produced in Examples and Comparative Examples in an amount of 0.3 g was applied to a center portion (region of about 5 mm×5 mm) of a copper plate having a thickness of 0.3 mm and a size of 2.5 cm square, and the thus produced sample was heated in a reflow oven. The heating conditions in the reflow oven were set as below: preheating at 150 to 180° C. for 90 seconds, and a peak temperature of 250° C. The period under which the temperature was at 220° C. or more was set to 120 seconds, and the cooling rate when the temperature was decreased from the peak temperature to 200° C. was set to 0.5 to 1.5° C./seconds. The reflowing conditions are harsh compared with general reflowing conditions, and are conditions under which intermetallic compounds easily deposit in tin of the solder.

The sample after the reflowing was cut, and the cross section was ground. Then, the ground cross section was observed with a scanning electron microscope, thereby measuring the size of the intermetallic compound structure deposited in the solder after reflowing. The samples were graded under the following criteria. The crack resistance is regarded as excellent when the size of the intermetallic compound structure is small.

A: The size of the maximum structure observed was less than 50 μm (crack resistance was excellent).

B: The size of the maximum structure observed was 50 μm or more and 100 μm or less (crack resistance was good).

C: The size of the maximum structure observed was more than 100 μm (crack resistance was insufficient).

FIG. 1 is an SEM (Scanning Electron Microscopic) photograph showing an intermetallic compound structure formed at the solder's cross section after reflowing. To be specific, FIG. 1 shows observation results of the sample in which the solder paste produced in Comparative Example 5 was used. The reference numeral 1 in FIG. 1 shows the intermetallic compound structure appeared in the solder after reflowing, and the intermetallic compound structure and its surrounding entirely shows the solder portion after reflowing. The length of the white line shown by reference numeral 2 in FIG. 1 shows the actual length of 10 μm.

<Voids Suppression>

The solder paste produced in Examples and Comparative Examples was printed on a printed circuit board for mounting chip components, and chip components were mounted by reflowing. The thickness of the printed solder paste was adjusted by using a metal mask with a thickness of 150 μm. After the printing of the solder paste, chip components of 2012 size (20 mm×12 mm) were placed on predetermined positions of the above-described printed circuit board, and heated in a reflow oven, thereby mounting the chip components. The reflowing conditions were set as below: preheating at 170 to 190° C., peak temperature of 245° C., the period under which the temperature was at 220° C. or more was set to 45 seconds, and the cooling rate when the temperature was decreased from the peak temperature to 200° C. was set to 3 to 8° C./seconds.

After cooling the printed circuit board, the surface conditions of the solder on the printed circuit board were observed with X-ray photographs, and a percentage of the total area of voids in the region where solder is formed (percentage of voids area) was measured. Status of voids generation was evaluated based on the following criteria by determining an average value for the percentage of voids area for 20 lands in the printed circuit board.

A: average value for the percentage of voids area was 5% or less, and effects of voids generation suppression was extremely good.

B: average value for the percentage of voids area was more than 5% and 7% or less, and effects of voids suppression was excellent.

C: average value for the percentage of voids area was more than 7%, and effects of voids generation suppression were insufficient.

<Erosion Resistance (Cu Erosion)>

The solder alloys produced in Examples and Comparative Examples were brought into melting state in a solder tank set to 260° C. Thereafter, a comb type electrode board having copper wirings is immersed in a melted solder for 5 seconds. For the comb type electrode board having copper wirings, a test board, "comb type electrode board type 2" specified in "insulation resistance test" of Annex 3 to JIS Z 3284-1994 "solder paste" was used.

Operation of immersing the comb type board in the melted solder was repeated, and the number of times that the size of the copper wirings of the comb type board was reduced to half was determined. In view of reliability of electronic circuits, the size of the copper wiring must not be reduced to half even if it is immersed 4 times or more. Those comb type boards whose size was not reduced to half even after the immersion of 4 times were evaluated as "A", and those comb type boards whose size was reduced to half after the immersion of 3 times or less were evaluated as "C".

<Durability (Solder Life)>

The solder paste produced in Examples and Comparative Examples was printed on a printed circuit board for mounting chip components, and chip components were mounted by reflowing. The thickness of the printed solder paste was adjusted by using a metal mask with a thickness of 150 μm. After the printing of the solder paste, chip components of 3216 size (32 mm×16 mm) were placed on predetermined positions of the above-described printed circuit board, and heated in a reflow oven, thereby mounting the chip components. The reflowing conditions are set as below: preheating at 170 to 190° C., peak temperature of 245° C., the period under which the temperature was at 220° C. or more was set to 45 seconds, and the cooling rate when the temperature was decreased from the peak temperature to 200° C. was set to 3 to 8° C./seconds.

Furthermore, the above-described printed circuit board was subjected to hot and cold cycle test, in which the above-described printed circuit board was kept under an environment of −40° C. for 30 minutes, and then kept under an environment of 125° C. for 30 minutes.

The solder portion of the printed circuit board that went through the hot and cold cycle 1500, 2000, 2500, 2750, and 3000 times was cut, and the cross section thereof was ground. The ground cross section was observed with an X-ray photograph, and evaluated whether the crack generated at the solder fillet portion completely transversed the fillet portion. The solder portion was ranked based on the criteria below. For each set of cycles, 20 chips were evaluated.

A+: crack that completely transversed the fillet portion was not generated until 3000 th cycle.

A: crack that completely transversed the fillet portion generated in 2751 th to 3000 th cycle.

A−: crack that completely transversed the fillet portion generated in 2501 th to 2750 th cycle.

B: crack that completely transversed the fillet portion generated in 2001 th to 2500 th cycle.

B−: crack that completely transversed the fillet portion generated in 1501 th to 2000 th cycle.

C: crack that completely transversed the fillet portion generated before 1500 th cycle.

<Overall Rating>

The score was calculated for "crack resistance (size of solder structure)", "voids suppression", and "erosion resistance (Cu erosion)", setting grade "A" as 2 points, "B" as 1 point, and "C" as 0. The score was calculated for "durability (solder life)", setting "A+" as 5 points, "A" as 4 points, "A−" as 3 points, "B" as 2 points, "B−" as 1 point, and "C" as 0. Then, the score total was calculated for each evaluation category, and based on the score total, the solder paste of Examples and Comparative Examples was comprehensively evaluated.

A+: extremely good (score total was 10 points or more, with no grade "B" or lower in the category.)

A: good (score total was 8 points or more, with no "B" or lower in the category of "durability (solder life)", with no grade "B−" or lower in the category.)

A−: mostly good (score total was 8 points or more, with no grade "B−" or lower in the category. Excluding those in the above-described overall rating of "A".)

B: practically acceptable: (score total was 6 points or more, with no grade "C" in the category.)

C: not good (score total was 6 or lower, or includes at least one "C" in the category.)

TABLE 4

| | Mixing formulation (mass %) | | | | |
| No. | Size of intermetallic compound structure | Voids suppression | Cu erosion | Solder life | Total points Overall evaluation |
| --- | --- | --- | --- | --- | --- |
| Example 1 | A | A | A | A+ | 11, A+ |
| Example 2 | A | A | A | A+ | 11, A+ |
| Example 3 | A | A | A | A+ | 11, A+ |
| Example 4 | B | A | A | A | 9, A |
| Example 5 | B | A | A | A | 9, A |
| Example 6 | A | B | A | A | 9, A |
| Example 7 | B | A | A | A | 9, A |
| Example 8 | A | B | A | A | 9, A |
| Example 9 | B | A | A | A | 9, A |
| Example 10 | A | B | A | A | 9, A |
| Example 11 | A | B | A | A | 9, A |
| Example 12 | B | A | A | A | 9, A |
| Example 13 | A | B | A | A | 9, A |
| Example 14 | A | B | A | A | 9, A |
| Example 15 | A | A | A | B | 8, A− |
| Example 16 | A | A | A | B | 8, A− |
| Example 17 | A | A | A | B | 8, A− |
| Example 18 | A | A | A | B | 8, A− |
| Example 19 | A | A | A | B | 8, A− |
| Example 20 | A | A | A | B | 8, A− |
| Example 21 | A | A | A | B | 8, A− |
| Example 22 | A | A | A | B | 8, A− |
| Example 23 | A | A | A | B | 8, A− |
| Example 24 | A | A | A | B | 8, A− |
| Example 25 | A | A | A | B | 8, A− |

TABLE 5

| | Mixing formulation (mass %) | | | | |
| No. | Size of intermetallic compound structure | Voids suppression | Cu erosion | Solder life | Total points Overall evaluation |
| --- | --- | --- | --- | --- | --- |
| Example 26 | A | A | A | B− | 7, B |
| Example 27 | A | A | A | B− | 7, B |
| Example 28 | A | A | A | B− | 7, B |
| Example 29 | A | A | A | B− | 7, B |
| Example 30 | A | A | A | B− | 7, B |
| Example 31 | A | A | A | B− | 7, B |
| Example 32 | A | A | A | B− | 7, B |
| Example 33 | A | A | A | B− | 7, B |
| Example 34 | A | A | A | A+ | 11, A+ |
| Example 35 | A | B | A | A+ | 10, A+ |
| Example 36 | A | A | A | A+ | 11, A+ |
| Example 37 | A | B | A | A+ | 10, A+ |
| Example 38 | A | A | A | A+ | 11, A+ |
| Example 39 | A | A | A | A+ | 11, A+ |
| Example 40 | A | A | A | B− | 7, B |
| Example 41 | A | A | A | B | 8, A− |
| Example 42 | A | A | A | B | 8, A− |
| Example 43 | A | B | A | B | 7, B |
| Example 44 | A | B | A | A | 9, A |
| Example 45 | A | B | A | A | 9, A |
| Example 46 | A | B | A | A | 9, A |
| Example 47 | A | A | A | A | 10, A+ |
| Example 48 | A | B | A | A | 9, A |
| Example 49 | A | A | A | A | 10, A+ |
| Example 50 | A | A | A | A | 10, A+ |
| Example 51 | A | A | A | B | 8, A |
| Example 52 | A | A | A | B | 8, A |
| Example 53 | A | A | A | B | 8, A |
| Example 54 | A | B | A | B | 7, B |

TABLE 6

| | Mixing formulation (mass %) | | | | |
| No. | Size of intermetallic compound structure | Voids suppression | Cu erosion | Solder life | Total points Overall evaluation |
| --- | --- | --- | --- | --- | --- |
| Comparative Example 1 | C | A | A | C | 4, C |
| Comparative Example 2 | C | A | A | C | 4, C |
| Comparative Example 3 | C | A | A | C | 4, C |
| Comparative Example 4 | A | C | A | C | 4, C |
| Comparative Example 5 | C | A | A | C | 4, C |
| Comparative Example 6 | C | A | A | C | 4, C |
| Comparative Example 7 | A | C | A | C | 4, C |
| Comparative Example 8 | C | A | A | C | 4, C |
| Comparative Example 9 | B | C | A | C | 3, C |
| Comparative Example 10 | B | A | A | C | 5, C |
| Comparative Example 11 | A | C | A | C | 4, C |
| Comparative Example 12 | C | A | A | C | 4, C |
| Comparative Example 13 | C | B | A | C | 3, C |
| Comparative Example 14 | B | C | A | C | 3, C |
| Comparative Example 15 | A | C | A | C | 4, C |
| Comparative | A | A | C | A | 6, C |

TABLE 6-continued

| No. | Mixing formulation (mass %) | | | | Total points Overall evaluation |
|---|---|---|---|---|---|
| | Size of intermetallic compound structure | Voids suppression | Cu erosion | Solder life | |
| Example 16 | | | | | |
| Comparative Example 17 | C | C | A | C | 2, C |
| Comparative Example 18 | C | C | A | C | 2, C |
| Comparative Example 19 | C | C | A | C | 2, C |
| Comparative Example 20 | C | C | A | C | 2, C |

<Production of Electronic Circuit Board>

In the above-described Examples and Comparative Examples, for the evaluation of the solder paste, chip components of 3216 size (32 mm×16 mm) and 2012 size (20 mm×12 mm) were mounted.

As is clear from the aforementioned evaluation results, with use of the solder paste of the aforementioned Examples, good results were obtained in the evaluations of the size of solder structure, voids suppression, Cu erosion, and solder life.

That is, with use of the solder paste of the aforementioned Examples, electronic circuit boards compatible for chip components of various sizes, and are excellent in connection reliability of chip components were produced.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The solder alloy and solder paste of the present invention are used in electronic circuit boards used for electrical and electronic devices.

The invention claimed is:

1. A tin-silver-copper solder alloy consisting of:
tin, silver, copper, bismuth, nickel, and cobalt,
wherein relative to the total amount of the solder alloy,
the silver content is above 2 mass % and 4 mass % or less,
the copper content is 0.1 mass % or more and 1 mass % or less,
the bismuth content is 0.5 mass % or more and 4.8 mass % or less,
the nickel content is 0.01 mass % or more and 0.15 mass % or less,
the cobalt content is 0.001 mass % or more and 0.008 mass % or less, and
the tin content is the remaining content.

2. The solder alloy according to claim 1, wherein the mass ratio (Ni/Co) of the nickel content relative to the cobalt content is 8 or more and 12 or less.

3. The solder alloy according to claim 1, wherein relative to the total amount of the solder alloy,
the bismuth content is 1.8 mass % or more and 4.2 mass % or less.

4. The solder alloy according to claim 1, wherein relative to the total amount of the solder alloy,
the copper content is 0.3 mass % or more and 0.7 mass % or less.

5. A solder paste comprising a flux, and a solder powder composed of a solder alloy,
wherein the solder alloy is a tin-silver-copper solder alloy consisting of tin, silver, copper, bismuth, nickel, and cobalt, and
relative to the total amount of the solder alloy,
the silver content is above 2 mass % and 4 mass % or less,
the copper content is 0.1 mass % or more and 1 mass % or less,
the bismuth content is 0.5 mass % or more and 4.8 mass % or less,
the nickel content is 0.01 mass % or more and 0.15 mass % or less,
the cobalt content is 0.001 mass % or more and 0.008 mass % or less, and
the tin content is the remaining content.

6. An electronic circuit board comprising a soldered portion soldered by a solder paste,
wherein the solder paste comprises a flux, and a solder powder composed of a solder alloy,
the solder alloy is a tin-silver-copper solder alloy consisting of tin, silver, copper, bismuth, nickel, and cobalt,
wherein relative to the total amount of the solder alloy,
the silver content is above 2 mass % and 4 mass % or less,
the copper content is 0.1 mass % or more and 1 mass % or less,
the bismuth content is 0.5 mass % or more and 4.8 mass % or less,
the nickel content is 0.01 mass % or more and 0.15 mass % or less,
the cobalt content is 0.001 mass % or more and 0.008 mass % or less, and
the tin content is the remaining content.

7. A tin-silver-copper solder alloy consisting of:
tin, silver, copper, bismuth, nickel, cobalt, and antimony, wherein
relative to the total amount of the solder alloy,
the silver content is above 2 mass % and 4 mass % or less,
the copper content is 0.1 mass % or more and 1 mass % or less,
the nickel content is 0.01 mass % or more and 0.15 mass % or less,
the cobalt content is 0.001 mass % or more and 0.008 mass % or less,
the antimony content is 0.4 mass % or more and 4.0 mass % or less,
the bismuth content is 0.8 mass % or more and 3.0 mass % or less, and
the tin content is the remaining content.

8. A tin-silver-copper solder alloy consisting of:
tin, silver, copper, bismuth, nickel, cobalt, and antimony,
wherein relative to the total amount of the solder alloy,
the silver content is above 2 mass % and 4 mass % or less,
the copper content is 0.1 mass % or more and 1 mass % or less,
the nickel content is 0.01 mass % or more and 0.15 mass % or less,
the cobalt content is 0.001 mass % or more and 0.008 mass % or less,
the antimony content is 0.1 mass % or more and 5.0 mass % or less,
the bismuth content is 0.8 mass % or more and 3.0 mass % or less, and
the tin content is the remaining content.

9. A tin-silver-copper solder alloy consisting of:
tin, silver, copper, bismuth, nickel, cobalt, and antimony,
wherein relative to the total amount of the solder alloy, the silver content is above 2 mass % and 4 mass % or less,
the copper content is 0.1 mass % or more and 1 mass % or less,
the bismuth content is 0.5 mass % or more and 4.8 mass % or less,
the nickel content is 0.01 mass % or more and 0.15 mass % or less,
the cobalt content is 0.001 mass % or more and 0.008 mass % or less,
the antimony content is 0.1 mass % or more and 5.0 mass % or less, and
the tin content is the remaining content.

10. A solder paste comprising a flux, and a solder powder composed of a solder alloy,
wherein the solder alloy is a tin-silver-copper solder alloy consisting of tin, silver, copper, bismuth, nickel, cobalt, and antimony, and
wherein relative to the total amount of the solder alloy,
the silver content is above 2 mass % and 4 mass % or less,
the copper content is 0.1 mass % or more and 1 mass % or less,
the bismuth content is 0.5 mass % or more and 4.8 mass % or less,
the nickel content is 0.01 mass % or more and 0.15 mass % or less,
the cobalt content is 0.001 mass % or more and 0.008 mass % or less,
the antimony content is 0.1 mass % or more and 5.0 mass % or less, and
the tin content is the remaining content.

11. An electronic circuit board comprising a soldered portion soldered by a solder paste, the solder paste comprising a flux, and a solder powder composed of a solder alloy,
wherein the solder alloy is a tin-silver-copper solder alloy consisting of tin, silver, copper, bismuth, nickel, cobalt, and antimony, and
wherein relative to the total amount of the solder alloy,
the silver content is above 2 mass % and 4 mass % or less,
the copper content is 0.1 mass % or more and 1 mass % or less,
the bismuth content is 0.5 mass % or more and 4.8 mass % or less,
the nickel content is 0.01 mass % or more and 0.15 mass % or less,
the cobalt content is 0.001 mass % or more and 0.008 mass % or less,
the antimony content is 0.1 mass % or more and 5.0 mass % or less, and
the tin content is the remaining content.

12. A tin-silver-copper solder alloy consisting of:
tin, silver, copper, bismuth, nickel, cobalt, and indium, wherein
relative to the total amount of the solder alloy,
the silver content is above 2 mass % and 4 mass % or less,
the copper content is 0.1 mass % or more and 1 mass % or less,
the bismuth content is 0.5 mass % or more and 4.8 mass % or less,
the nickel content is 0.01 mass % or more and 0.15 mass % or less,
the cobalt content is 0.001 mass % or more and 0.008 mass % or less,
the indium content is 2.2 mass % or more and 6.2 mass % or less, and
the tin content is the remaining content.

13. The solder alloy according to claim 12, wherein the mass ratio (In/Bi) of the indium content relative to the bismuth content is 0.5 or more and 4.2 or less.

14. A solder paste comprising a flux, and a solder powder composed of a solder alloy,
wherein the solder alloy is a tin-silver-copper solder alloy consisting of tin, silver, copper, bismuth, nickel, cobalt, and indium, and
wherein relative to the total amount of the solder alloy,
the silver content is above 2 mass % and 4 mass % or less,
the copper content is 0.1 mass % or more and 1 mass % or less,
the bismuth content is 0.5 mass % or more and 4.8 mass % or less,
the nickel content is 0.01 mass % or more and 0.15 mass % or less,
the cobalt content is 0.001 mass % or more and 0.008 mass % or less,
the indium content is 2.2 mass % or more and 6.2 mass % or less, and
the tin content is the remaining content.

15. An electronic circuit board comprising a soldered portion soldered by a solder paste, the solder paste comprising a flux, and a solder powder composed of a solder alloy,
wherein the solder alloy is a tin-silver-copper solder alloy consisting of tin, silver, copper, bismuth, nickel, cobalt, and indium, and
wherein relative to the total amount of the solder alloy,
the silver content is above 2 mass % and 4 mass % or less,
the copper content is 0.1 mass % or more and 1 mass % or less,
the bismuth content is 0.5 mass % or more and 4.8 mass % or less,
the nickel content is 0.01 mass % or more and 0.15 mass % or less,
the cobalt content is 0.001 mass % or more and 0.008 mass % or less,
the indium content is 2.2 mass % or more and 6.2 mass % or less, and
the tin content is the remaining content.

16. A tin-silver-copper solder alloy consisting of:
tin, silver, copper, bismuth, nickel, cobalt, antimony, and indium,
wherein relative to the total amount of the solder alloy,
the silver content is above 2 mass % and 4 mass % or less,
the copper content is 0.1 mass % or more and 1 mass % or less,
the bismuth content is 0.5 mass % or more and 4.8 mass % or less,
the nickel content is 0.01 mass % or more and 0.15 mass % or less,
the cobalt content is 0.001 mass % or more and 0.008 mass % or less,
the antimony content is 0.1 mass % or more and 5.0 mass % or less;
the indium content is 2.2 mass % or more and 6.2 mass % or less, and
the tin content is the remaining content.

17. A solder paste comprising a flux, and a solder powder composed of a solder alloy,
wherein the solder alloy is a tin, silver-copper solder alloy consisting of tin, silver, copper, bismuth, nickel, cobalt, antimony, and indium, and
wherein relative to the total amount of the solder alloy,
the silver content is above 2 mass % and 4 mass % or less, the copper content is 0.1 mass % or more and 1 mass % or less, the bismuth content is 0.5 mass % or more and 4.8 mass % or less, the nickel content is 0.01 mass % or more and 0.15 mass % or less, the cobalt content is 0.001 mass % or more and 0.008 mass % or less, the antimony content is 0.1 mass % or more and 5.0 mass % or less;

the indium content is 2.2 mass % or more and 6.2 mass % or less, and the tin content is the remaining content.

18. An electronic circuit board comprising a soldered portion soldered by a solder paste, the solder paste comprising a flux, and a solder powder composed of a solder alloy, wherein the solder alloy is a tin-silver-copper solder alloy consisting of tin, silver, copper, bismuth, nickel, cobalt, antimony and indium, wherein relative to the total amount of the solder alloy, the silver content is above 2 mass % and 4 mass % or less, the copper content is 0.1 mass % or more and 1 mass % or less, the bismuth content is 0.5 mass % or more and 4.8 mass % or less, the nickel content is 0.01 mass % or more and 0.15 mass % or less, the cobalt content is 0.001 mass % or more and 0.008 mass % or less, the antimony content is 0.1 mass % or more and 5.0 mass % or less, the indium content is 2.2 mass % or more and 6.2 mass % or less, and the tin content is the remaining content.

* * * * *